(12) United States Patent
Ko et al.

(10) Patent No.: US 10,778,259 B2
(45) Date of Patent: Sep. 15, 2020

(54) WIRELESS COMMUNICATION DEVICE AND METHOD OF OPERATING THE SAME

(71) Applicant: SAMSUNG ELECTRONICS CO., LTD., Suwon-si, Gyeonggi-do (KR)

(72) Inventors: Hyoungmin Ko, Suwon-si (KR); Juhyuk Im, Suwon-si (KR); Hoguen Ji, Suwon-si (KR)

(73) Assignee: SAMSUNG ELECTRONICS CO., LTD., Suwon-si, Gyeonngi-Do (KR)

(*) Notice: Subject to any disclaimer, the term of this patent is extended or adjusted under 35 U.S.C. 154(b) by 0 days.

(21) Appl. No.: 16/683,390

(22) Filed: Nov. 14, 2019

(65) Prior Publication Data
US 2020/0169274 A1 May 28, 2020

(30) Foreign Application Priority Data

Nov. 28, 2018 (KR) .................. 10-2018-0150088
Apr. 19, 2019 (KR) .................. 10-2019-0046085

(51) Int. Cl.
*H03M 13/45* (2006.01)
*H03M 13/00* (2006.01)
*H04L 27/26* (2006.01)
*H04L 5/00* (2006.01)

(52) U.S. Cl.
CPC ....... *H03M 13/6502* (2013.01); *H03M 13/45* (2013.01); *H04L 5/001* (2013.01); *H04L 27/2647* (2013.01)

(58) Field of Classification Search
CPC ... H03M 13/6502; H03M 13/45; H04L 5/001; H04L 27/2647
See application file for complete search history.

(56) References Cited

U.S. PATENT DOCUMENTS

| | | | |
|---|---|---|---|
| 9,119,195 B2 | 8/2015 | McBeath et al. | |
| 2009/0245435 A1 | 10/2009 | Challa et al. | |
| 2011/0182385 A1 | 7/2011 | Doan et al. | |
| 2013/0205176 A1* | 8/2013 | Qian | H04L 1/20 714/704 |
| 2017/0338915 A1 | 11/2017 | Kim et al. | |
| 2018/0026662 A1* | 1/2018 | Kang | H04L 1/0046 714/776 |
| 2018/0083733 A1 | 3/2018 | Chen et al. | |
| 2018/0146460 A1 | 5/2018 | Lee et al. | |
| 2019/0223164 A1* | 7/2019 | He | H04L 5/00 |

* cited by examiner

*Primary Examiner* — Siu M Lee
(74) *Attorney, Agent, or Firm* — F. Chau & Associates, LLC

(57) ABSTRACT

Systems and methods are described for a method of operating a wireless communication device includes receiving a physical downlink control channel (PDCCH) including a plurality of control channel elements (CCE), storing a plurality of LLRs generated by demodulating the PDCCH in a data buffer, storing at least one address of the LLRs, corresponding to a plurality of PDCCH candidates in accordance with an aggregation level for the CCEs, in a plurality of address buffers, and performing blind decoding on the PDCCH candidates by using the data buffer and the address buffers.

22 Claims, 15 Drawing Sheets

WIRELESS COMMUNICATION DEVICE AND METHOD OF OPERATING THE SAME

CROSS-REFERENCE TO RELATED APPLICATIONS

This application claims the benefit of Korean Patent Application Nos. 10-2018-0150088 and 10-2019-0046085, filed on Nov. 28, 2018, and Apr. 19, 2019, in the Korean Intellectual Property Office, the disclosures of which are incorporated by reference herein in their entirety.

BACKGROUND

The inventive concept relates to a wireless communication device, and more particularly, to a method of managing data required for decoding.

Wireless communication, i.e., the transfer of information or power between two or more devices, has become an essential tool for personal and business use. With file sizes and device quantities increasing, the demand for high speed data services for wireless communication devices has increased.

5G, or new radio (NR), communication systems aim to provide ultra-high-speed data services, with speeds of several Gbps, using an ultra-wide bandwidth greater than 100 MHz. By comparison, conventional long-term evolution (LTE) and LTE-A do not meet these needs. Thus, methods of transmitting a signal using a wide frequency band is necessary to meet current demand. However, the frequencies used for ultra-wide bandwidth communications may be difficult to secure. In some cases, the desired transmission rates may be achieved by using a millimeter-wave hand such as a 28 GHz band or 60 GHz band.

A wireless communication device may perform decoding on a physical downlink control channel (PDCCH) received from a base station to perform communication in the 5G system. However, there is a need for methods of efficiently managing the data required for decoding the PDCCH using a buffer configuration in a wireless communication device for 5G communication systems.

SUMMARY

The inventive concept provides a wireless communication device capable of improving memory use efficiency by preventing data required for decoding a physical downlink control channel (PDCCH) from being repeatedly stored and a method of operating the same.

According to an aspect of the inventive concept, there is provided a method of operating a wireless communication device. The method includes receiving a PDCCH including a plurality of control channel elements (CCE), storing a plurality of log likelihood ratios (LLRs) in a data buffer, wherein the LLRs are generated by demodulating the PDCCH and correspond to a plurality of PDCCH candidates, each of the PDCCH candidates having an aggregation level corresponding to a number of CCEs, storing at least one address of the LLRs in a plurality of address buffers, and performing blind decoding on the PDCCH candidates by using the data buffer and the address buffers.

According to an aspect of the inventive concept, there is provided a method of operating a wireless communication device for managing data required for performing blind decoding. The method includes generating a CCE index and LLRs corresponding thereto from a PDCCH including a plurality of CCEs, storing the LLRs in a data buffer, and storing at least one address of the LLRs in at least one address buffer selected from a plurality of address buffers based on the CCE index.

According to an aspect of the inventive concept, there is provided a wireless communication device including a radio frequency (RF) integrated circuit configured to receive a PDCCH including a plurality of CCEs from a base station and a controller configured to perform blind decoding on a plurality of PDCCH candidates in accordance with an aggregation level for the CCEs. The controller further includes a data management circuit configured to store LLRs generated by the PDCCH in a data buffer and to store at least one address of the LLRs in at least one address buffer selected from a plurality of address buffers based on a CCE index corresponding to the LLRs.

According to an aspect of the inventive concept, there is provided a method of wireless communication, the method comprising receiving a PDCCH, storing PDCCH data in a data buffer, wherein the PDCCH data correspond to a plurality of PDCCH candidates, storing addresses of the PDCCH data in a plurality of address buffers, wherein each of the plurality of address buffers corresponds to one of the PDCCH candidates, performing blind decoding on each of the PDCCH candidates based on addresses of PDCCH data stored in a corresponding address buffer of the plurality of address buffers.

BRIEF DESCRIPTION OF THE DRAWINGS

The following detailed description, in conjunction with the accompanying drawings, will more clearly explain embodiments of the inventive concept.

DETAILED DESCRIPTION OF THE EMBODIMENTS

The present disclosure describes systems and methods that provide for efficiently managing data used in decoding the physical downlink control channel (PDCCH). Example embodiments may include a wireless communication device capable of improving the use efficiency of memory by preventing data required for decoding a PDCCH from being repeatedly stored and a method of operating the same.

Figure 1:
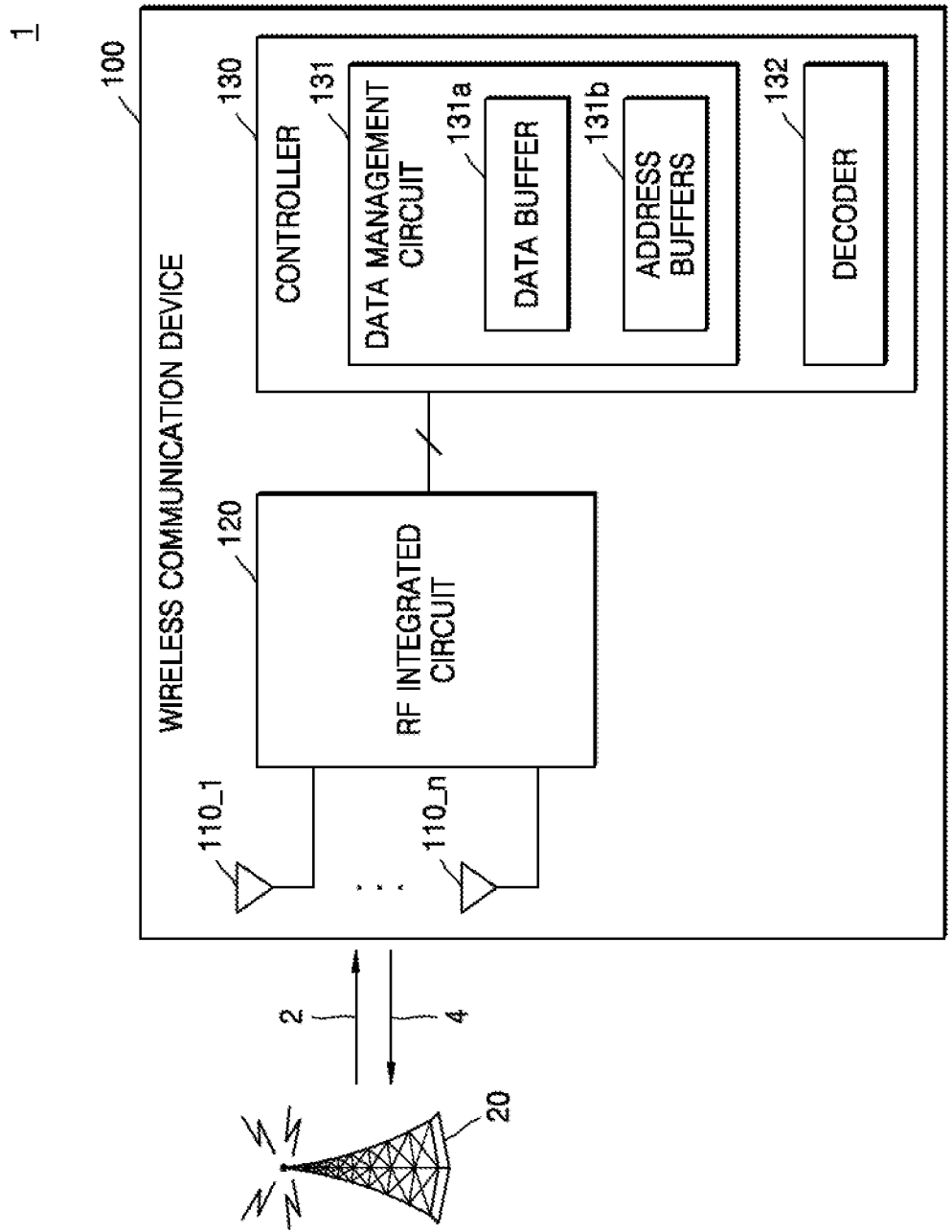
FIG. 1 is a schematic block diagram of a wireless communication system according to an exemplary embodiment of the inventive concept.
Figure 2:
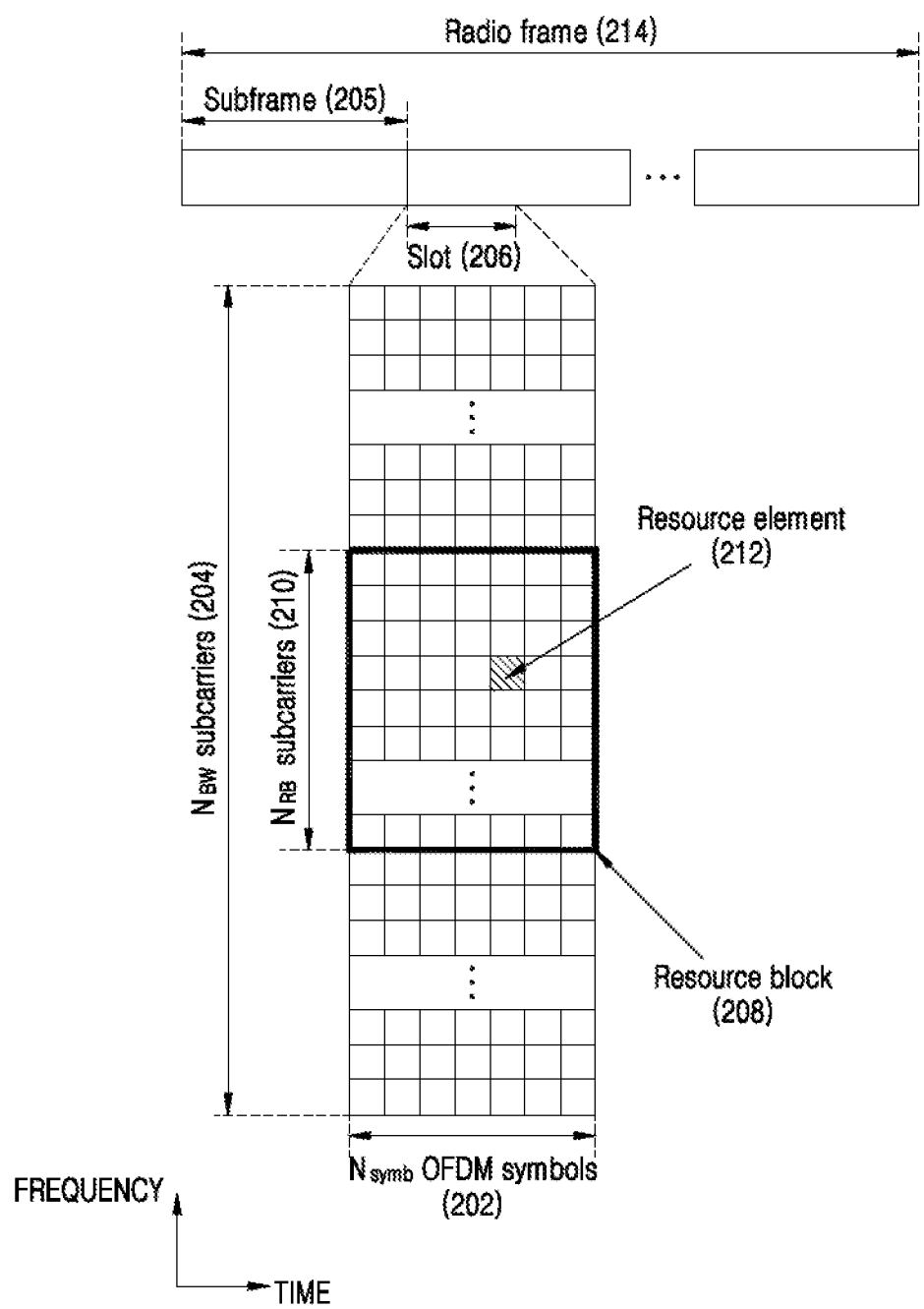
FIG. 2 is a view illustrating a basic structure of a time-frequency region in a wireless communication system according to an exemplary embodiment of the inventive concept.
Figure 3:
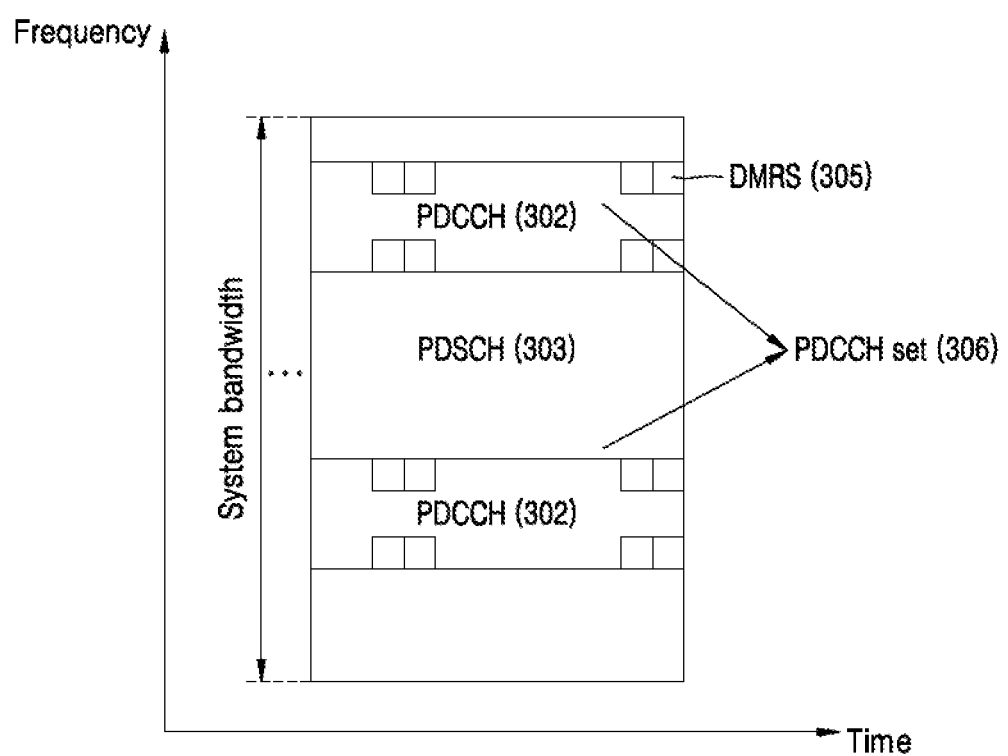
FIG. 3 is a view illustrating a physical downlink control channel (PDCCH) in a wireless communication system according to an exemplary embodiment of the inventive concept.
Figure 4:
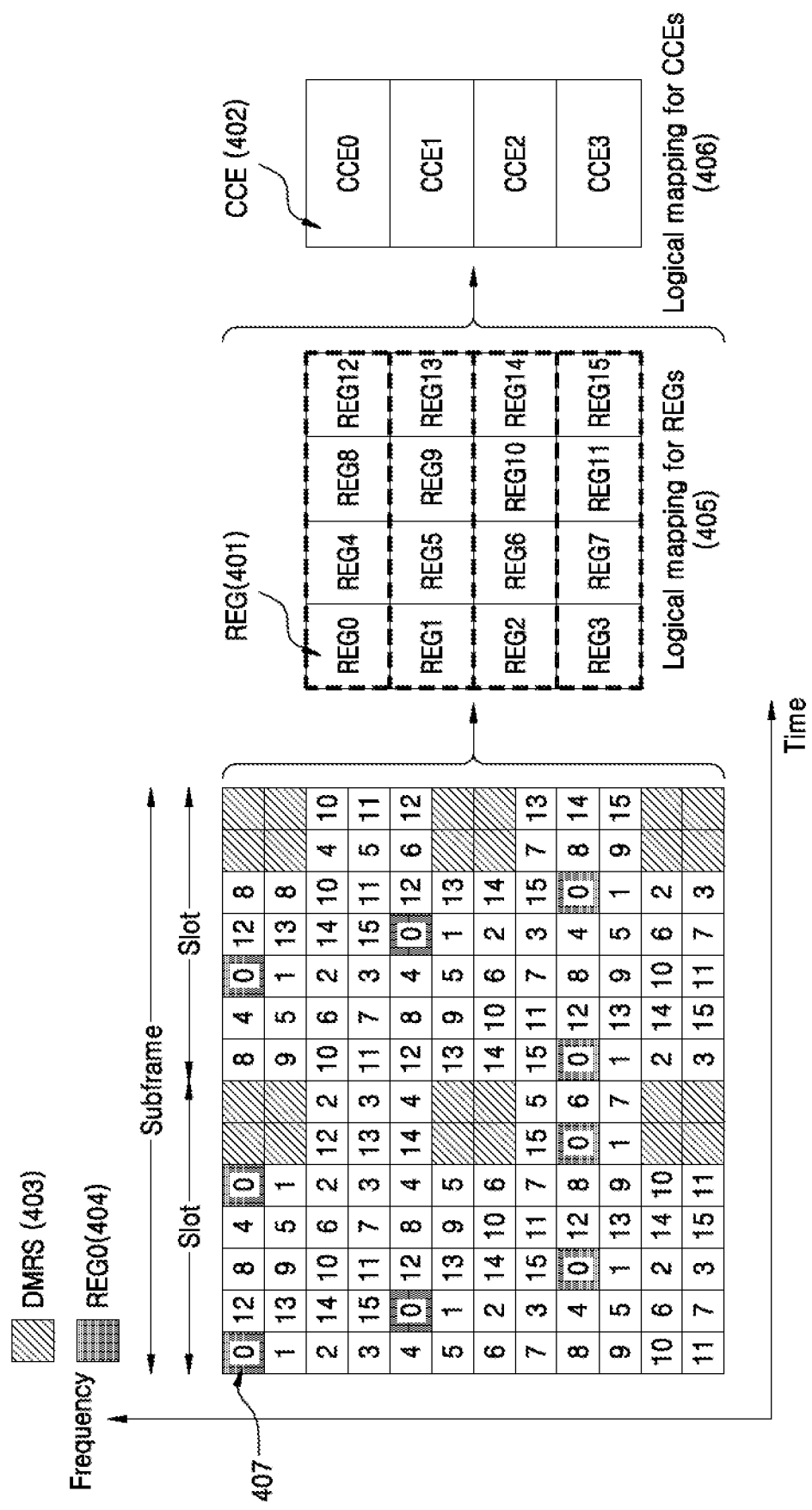
FIG. 4 is a view illustrating a resource mapping method of a PDCCH in a wireless communication system according to an exemplary embodiment of the inventive concept.
Figure 5:
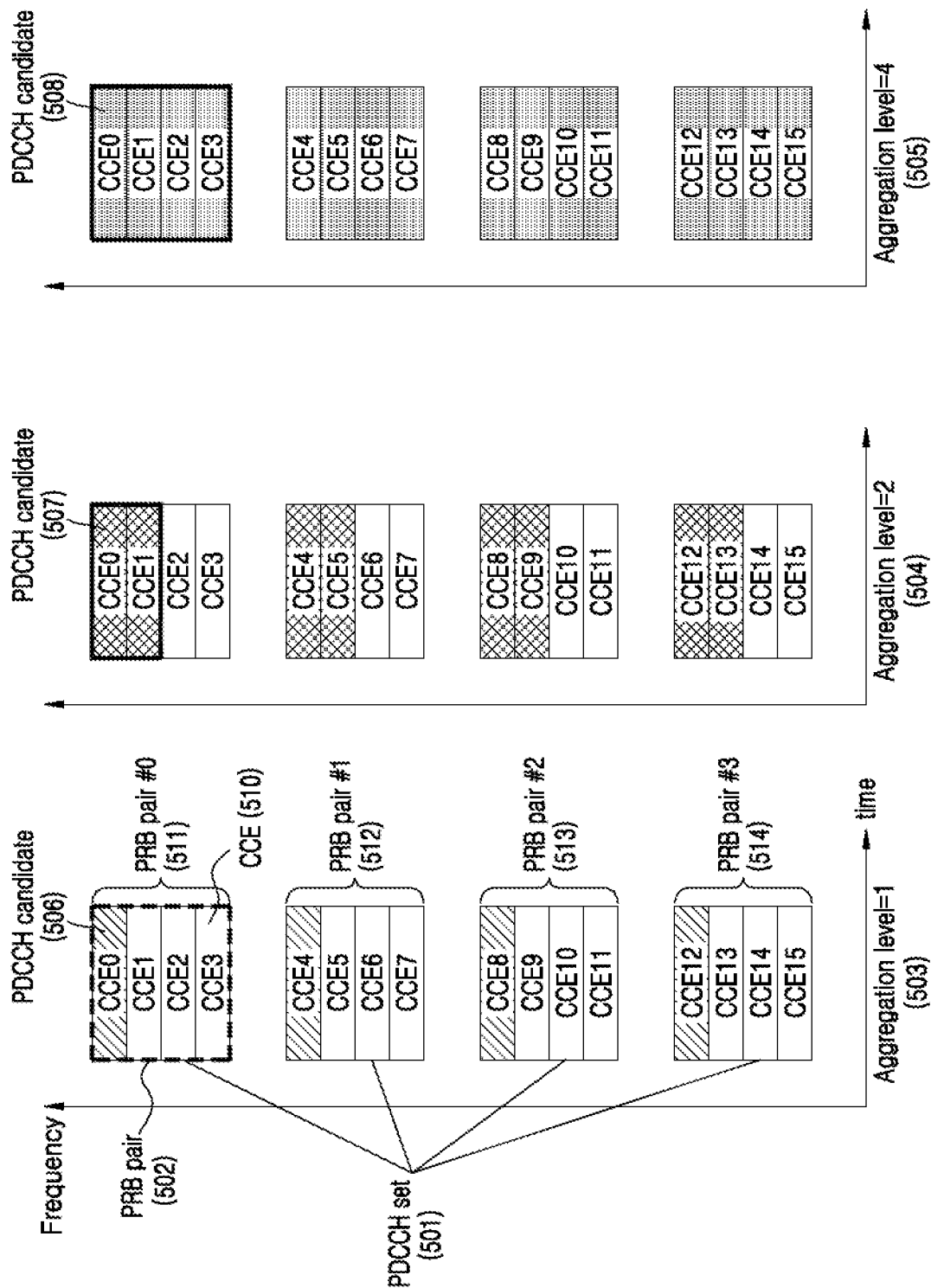
FIG. 5 is a view illustrating a search space of a PDCCH in a wireless communication system and a blind decoding method for the search space according to an exemplary embodiment of the inventive concept.

FIG. 1 is a schematic block diagram of a wireless communication system 1 according to an exemplary embodiment of the inventive concept. FIG. 2 is a view illustrating a basic structure of a time-frequency region in a wireless communication system. FIG. 3 is a view illustrating a physical downlink control channel (PDCCH) in a wireless communication system. FIG. 4 is a view illustrating a resource mapping method of a PDCCH in a wireless communication system. FIG. 5 is a view illustrating a search space of a PDCCH in a wireless communication system and a blind decoding method for the search space.

The wireless communication system 1 may be, for example, a long term evolution (LTE) system, a 5G system, a code division multiple access (CDMA) system, a global system for mobile communications (GSM) system, a wireless local area network (WLAN) system, or another arbitrary wireless communication system. Hereinafter, the wireless communication system 1 will reference the 5G system. However, exemplary embodiments of the inventive concept are not limited thereto.

Referring to FIG. 1, the wireless communication system 1 may include a wireless communication device 100 and a base station 20. The wireless communication device 100 and the base station 20 may communicate through a downlink channel 2 and an uplink channel 4. The wireless communication device 100 may include a plurality of antennas 110_1 to 110_n, a radio frequency (RF) integrated circuit 120, a controller 130, and a buffer 140.

The wireless communication device 100 may refer to varying devices that communicate with the base station 20 and may transmit and receive a data signal or control information. For example, the wireless communication device 100 may be referred to as a user equipment (UE), a mobile station (MS), a mobile terminal (MT), a user terminal (UT), a subscriber station (SS), or a portable device. The base station 20 may refer to a stationary station that communicates with the wireless communication device 100 or another base station. The base station 20 may be referred to as a node B, an evolved-node B (eNB), a base transceiver system (BTS), or an access point (AP).

A wireless communication network between the wireless communication device 100 and the base station 20 may support a plurality of users to communicate with each other by sharing available network resources. For example, in the wireless communication network, information may be transmitted by a varying method such as code division multiple access (CDMA), frequency division multiple access (FDMA), time division multiple access (TDMA), orthogonal frequency division multiple access (OFDMA), or a single carrier frequency division multiple access (SC-FDMA). Hereinafter, 5G communication technology will be described as being applied to wireless communications between, for example, the wireless communication device 100 and the base station 20. Therefore, embodiments of the inventive concept may be applied to next-generation communication technologies other than the 5G communication technology.

The RF integrated circuit 120 may receive a downlink signal including the control information or the data signal from the base station 20 through the plurality of antennas 110_1 to 110_n. The RF integrated circuit 120 may include a low noise amplifier for amplifying the downlink signal and a mixer for down-converting a frequency of the downlink signal. The RF integrated circuit 120 down-converts the downlink signal of an RF band into a base band and may provide the base band to the controller 130.

The controller 130, according to an embodiment, may include a data management circuit 131 and a decoder 132. The data management circuit 131 may manage data required for decoding the PDCCH received from the base station 20 and may include a plurality of buffers 131a and 131b to manage the data. Hereinafter, the data management circuit 131 may perform a series of storing (or buffering) data operations required for decoding the PDCCH in buffers and providing proper data to the decoder 132 in accordance with a decoding operation of the decoder 132.

Hereinafter, to help to understand the operations of the data management circuit 131, FIGS. 2 to 5 will be first described. It will be sufficiently understood FIGS. 2 to 5 are examples of the wireless communication system 1, and the inventive concept is not limited thereto.

Referring to FIG. 2, the horizontal axis represents a time region, and the vertical axis may represent a frequency region. The least transmission unit in the time region is an orthogonal frequency division multiplexing (OFDM) symbol. $N_{symb}$ OFDM symbols 202 may configure one slot 206, and two slots may configure one sub-frame 205. For example, a length of the slot 206 is 0.5 ms, and a length of the sub-frame may be 1.0 ms. Additionally, a radio frame 214 may be a time-region unit configured by ten sub-frames 205.

The least transmission unit in the frequency region is a sub-carrier. A bandwidth of an entire system transmission band may be configured by configured by $N_{BW}$ subcarriers 204. A basic unit of resources in a time-frequency region as a resource element (RE) 212 may be represented by an OFDM symbol index and a subcarrier index. A resource block (RB) 208 may be defined by $N_{symb}$ OFDM symbols in the time region and $N_{RB}$ subcarriers 210 in the frequency region. Therefore, the one RB 208 may be configured by $N_{symb}*N_{RB}$ REs 212. An RB pair as a unit in which two RBs may be connected in a time axis may be configured by $N_{symb}*2\ N_{RB}$ REs 212. On the other hand, the PDCCH may be transmitted to the wireless communication device in the base station in the wireless communication system through the resources of the time-frequency region of FIG. 2. Downlink control information (DCI) may transmit through the PDCCH. The DCI may include downlink scheduling assignment-related information, including physical downlink shared channel (PDSCH) resource designation, transmission format, and HARQ information items and spatial multiplexing-related control information.

Referring to FIG. 3, a PDCCH 302 may be frequency multiplexed with a PDSCH 303 and may be transmitted. In the base station, resources of the PDCCH 302 and the PDSCH 303 may be properly assigned through scheduling. Therefore, coexistence with data transmission for the wireless communication device may be effectively supported. A plurality of PDCCHs 302 may configure one PDCCH set 306, and the PDCCH set 306 may be assigned in units of RB pairs. Position information of the PDCCH set 306 is terminal-particularly set and may be signalized through remote radio control (RRC). Up to two PDCCH sets 306 may be set in each wireless communication device. One PDCCH set 306 may be simultaneously multiplexed and set in different terminals. On the other hand, in the PDCCH 302, a demodulation reference signal (DMRS) 305 may be used as a reference signal.

Referring to FIG. 4, an RB pair illustrates as an example, and one RB may include 16 REGs 401. The REGs included in the RB pair may be mapped to REG 401 indexes corresponding to $\{0, 1, 2, \ldots,$ and $15\}$. At this time, the REG in which a DMRS 403 is mapped, is excluded from numbering.

A set of REGs corresponding to respective indexes may configure one REG 401. For example, nine REGs 407s are mapped to an index 0 in the RB pair illustrated in FIG. 4, and the nine REGs may configure a REG0 404. The REGs numbered by the respective indexes x (x=$\{0, 1, 2, \ldots,$ and $15\}$) may configure REGx. In describing embodiments, according to the inventive concept, for convenience sake, for the REG 401 that exists in the RB pair, a logical mapping method like 405 of FIG. 4 is premised.

The resource assignment of the PDCCH is based on a control channel element (CCE) 402. One CCE 402 may be configured by four or eight REGs 401. The number of REGs 401 by the CCE 402 may vary in accordance with a cyclic prefix (CP) length and sub-frame setting information. In FIG. 4, an example in which the four REGs 401 configure one CCE 402 is illustrated. In more detail, by a logical mapping method like 305 of FIG. 4, REG0, REG4, REG8, and REG12 may be mapped to CCE0, REG1, REG5, REG9, and REG13 may be mapped to CCE1, REG2, REG6, REG10, and REG14 may be mapped to CCE2, and REG3, REG7, REG11, and REG15 may be mapped to CCE3.

Therefore, when the four REGs 401 configure one CCE 402, the RB pair may include four CCEs 402. In describing embodiments, according to the inventive concept, for convenience sake, for the CCE 402 that exists in the RB pair, a logical mapping method like 406 of FIG. 4 is premised. A PDCCH transmitting method may be classified into a localized transmission and distributed transmission per a mapping method between the CCE 402 and the REG 401.

Describing the search space in the PDCCH, the PDCCH may support the terminal-particular search space. The search space is a set of PDCCH candidates configured by CCEs that the wireless communication device attempts to decode at a given aggregation level (hereinafter, referred to as a CCE aggregation level). The PDCCH may have an aggregation level of 1, 2, 4, 8, 16, or 32, which may be determined in accordance with a system parameter such as a CP length, sub-frame setting, a PDCCH format, a localized or distributed transmitting method, or the total number of CCEs. Since various aggregation levels at which the plurality of CCEs are made a bundle exist, the wireless communication device may have a plurality of search spaces in accordance with an aggregation level. The quantity of PDCCH candidates that may be decoded by the wireless communication device in accordance with the aggregation level in the PDCCH may vary.

In FIG. 5, an example in which one PDCCH set 501 is configured by four RB pairs is illustrated. Referring to FIG. 5, an RB pair 502 includes four CCEs 510, M describing embodiments, according to the inventive concept, a logical mapping method 406 for the CCE of FIG. 4 is premised.

In FIG. 5, an example of a search space for an aggregation level-1 503, an aggregation level-2 504, and an aggregation level-4 505 is illustrated. At the aggregation level-1 503, a PDCCH candidate 506 may be mapped to a CCE 510. At the aggregation level-2 504, a PDCCH candidate 507 may be mapped to two CCEs 510. At the aggregation level-4 505, a PDCCH candidate 508 may be mapped to four CCEs 510. Accordingly, at the aggregation level-1 503, four CCEs (CCE0, CCE4, CCE8, and CCE12) exist in the PDCCH candidate 506, at the aggregation level-2 504, four CCE pairs ({CCE0, CCE1}, {CCE4, CCE5}, {CCE8, CCE9}, and {CCE12 CCE13}) exist in the PDCCH candidate 507, and, at the aggregation level-4 505, two CCE pairs ({CCE0, CCE1, CCE2, CCE3} and {CCE8, CCE9, CCE10, CCE11}) may exist.

Returning to FIG. 1, obtaining the DCI included in the PDCCH, the decoder 132 may perform blind decoding on PDCCH candidates determined in accordance with an aggregation level. For example, illustrated in FIG. 5, when the PDCCH candidates 506, 507, and 508 exist, the decoder 132 performs a decoding operation on four PDCCH candidates 506 at the aggregation level-1 503. The decoder 132 may also perform a decoding operation on four PDCCH candidates 507 at the aggregation level-2 504 and may perform a decoding operation on two PDCCH candidates 508 at the aggregation level-4 505. For the above-described blind decoding operation of the decoder 132, the PDCCH candidates 506, 507, and 508 have to be stored in a buffer (or memory) in the wireless communication device 100. In a conventional art, when the blind decoding operation of the decoder 132 is performed, although pieces of partial data (CCE0, CCE1, CCE4, CCE8, CCE9, and CCE12) are repeatedly used at least twice, without considering the repeated use of the partial data, the PDCCH candidates 506, 507, and 508 are stored. In the conventional art, CCE0, CCE4, CCE8, and CCE12 are stored in a first region of a buffer as the PDCCH candidates 506 of the aggregation level-1 503, {CCE0, CCE1}, {CCE4, CCE5}, {CCE8, CCE9}, and {CCE12, CCE13} are stored in a second region of the buffer as the PDCCH candidates 507 of the aggregation level-2 504, and {CCE0, CCE1, CCE2, CCE3} and {CCE8, CCE9, CCE10, CCE11} are stored in a third region of the buffer as the PDCCH candidates 508 of the aggregation level-4 505. Therefore, CCE0, CCE1, CCE4, CCE8, CCE9, and CCE12 are repeatedly stored in the buffer, and the buffer is inefficiently used.

As a resolution, the data management circuit 131 according to an embodiment of the inventive concept may include a data buffer 131*a* and a plurality of address buffers 131*b*. Additionally, to prevent data from being repeatedly stored, the data required for decoding is stored in the data buffer 131*a*. Then, an address of the data buffer 131*a* (i.e., the address of the LLRs stored in the data buffer) may be stored in the address buffers 131*b*. To perform the blind decoding from the data buffer 131*a*, with reference to the address stored in the address buffers 131*b*, the data management circuit 131 reads the data required for the decoder 132 and may provide the read data to the decoder 132.

In detail, the data management circuit 131 may store a plurality of log likelihood ratios (LLR). The LLRs are generated by the controller 130, demodulating the PDCCH in the data buffer 131*a* and the address of the data buffer 131*a*. In accordance with the aggregation levels of the CCEs included in the PDCCH is stored, the respectively corresponding to the plurality of PDCCH candidates may be stored in the address buffers 131*b*.

In FIG. 5, the data management circuit 131 may store a plurality of LLRs generated by demodulating CCE0 to CCE15 included in the PDCCH in the data buffer 131*a* in the order of generation (or in a prescribed order). Additionally, the data management circuit 131 may store addresses of the data buffer 131*a* in which LLRs corresponding to CCE0, CCE4, CCE8, and CCE12 that are the PDCCH candidates 506 of the aggregation level-1 503 are stored in a first address buffer among the address buffers 131*b*, may store addresses of the data buffer 131*a* in which LLRs corresponding to {CCE0, CCE1}, {CCE4, CCE5}, {CCE8, CCE9}, and {CCE12, CCE13} that are the PDCCH candidates 507 of the aggregation level-2 504 are stored in a second address buffer among the address buffers 131*b*, and may store addresses of the data buffer 131*a* in which LLRs corresponding to {CCE0, CCE1, CCE2, CCE3}, and {CCE8, CCE9, CCE10, CCE11} that are the PDCCH candidates 508 of the aggregation level-4 505 are stored in a third address buffer among the address buffers 131*b*. According to embodiments, an operation of storing the LLRs in the data buffer and an operation of storing the addresses of the LLRs in the address buffers may be performed in parallel. According to embodiments, the data buffer 131*a* and the address buffers 131*b* are physically separate from each other or may be virtually separated from each other in one buffer configuration. Additionally, the number of address buffers 131*b* may be configured to suit the number of supportable CCE aggregation levels. For example, as illustrated in FIG. 5, when the three aggregation levels 504, 505, and 506 are supportable, the data management circuit 131 may be configured to include three address buffers (first to third address buffers). The first address buffer is assigned to store the address of the data buffer 131*a*, in which the LLRs of the PDCCH candidates 506 of the aggregation level-1 503 are stored. The second address buffer is assigned to store the address of the data buffer 131*a*, in which the LLRs of the PDCCH candidates 507 of the aggregation level-2 504 are stored. The third address buffer may be assigned to store the address of the data buffer 131*a*, in which the LLRs of the PDCCH candidates 508 of the aggregation level-4 505 are stored, which is an exemplary embodiment. When more aggregation levels are supportable, the data management circuit 131 may be configured to include more address buffers.

The data management circuit 131 according to an embodiment may store an address of a target LLR in the address buffers 131*b* in at least one address buffer based on a CCE index corresponding to the target LLR stored in the data buffer 131*a*. For example, the data management circuit 131 may store an address of the data buffer 131*a*, in which the LLRs corresponding to CCE0 of FIG. 5 are stored, in the first address buffer, the second address buffer, and the third address buffer with reference to an index of CCE0. According to embodiments, a CCE index may be generated with LLRs corresponding to the CCE index when a demodulating operation is performed on the PDCCH. When the demodulating operation is performed on CCE0 of FIG. 5, a CCE index that represents CCE0 may be generated with the LLRs corresponding to CCE0.

The data management circuit 131, according to an embodiment, may provide data required for the decoder 132 to perform blind decoding on PDCCH candidates by using the data buffer 131*a* and the address buffers 131*b*. For example, when the decoder 132 performs decoding of the aggregation level-1 503 on the PDCCH candidates 506, the data management circuit 131 obtains (or reads) addresses in which the LLRs corresponding to the PDCCH candidates 506 CCE0, CCE4, CCE8, and CCE12 are stored from the first address buffer. Additionally, circuit 131 obtains (or reads) the LLRs corresponding to CCE0, CCE4, CCE8, and CCE12 from the data buffer 131*a* by using the obtained addresses, and may provide the obtained LLRs to the decoder 132.

According to an embodiment, the data management circuit 131 may store representative addresses of LLR groups. The LLR groups are guaranteed with continuity in the address buffers 131*b*, which consider continuously stored LLRs in the data buffer 131*a*, in accordance with a resource mapping pattern of the CCEs of the PDCCH. Detailed descriptions thereof will be given with reference to FIG. 10.

The data management circuit 131 may be implemented by hardware such as a combination of a particular application integrated circuit, a field-programmable, gate array, a logic gate, a system on a chip, or a varying type of processing circuit (or a control circuit). Furthermore, the data management circuit 131 may be implemented by software such as instructions or code that may be executed by a processor such as controller 130. Additionally, as an exemplary embodiment, the data buffer 131*a* and the address buffers 131*b* in the data management circuit 131 may be implemented by volatile memory such as dynamic random access memory (DRAM) or static random access memory (SRMA). Additionally, the data buffer 131*a* and the address buffers 131*b* may also be implemented by non-volatile memory such as phase-change random access memory (PRAM), magnetoresistive random access memory (MRAM), resistive random access memory (ReRAM), or ferroelectric random access memory (FeRAM).

Figure 6:
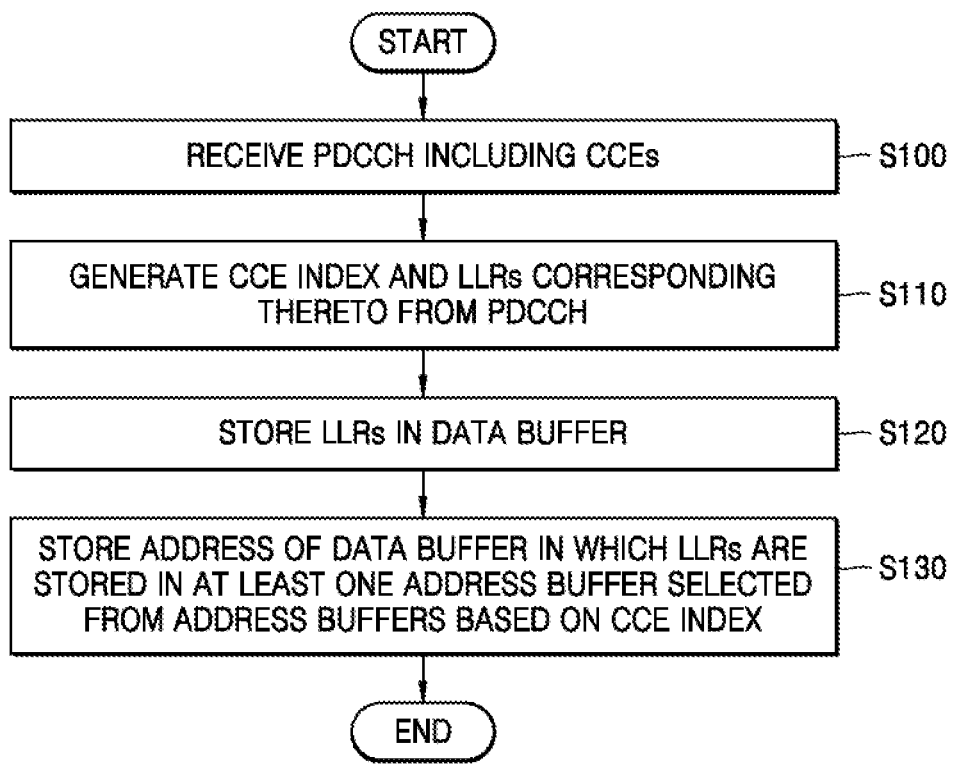
FIG. 6 is a flowchart illustrating a method of buffering data required for decoding of a wireless communication device according to an exemplary embodiment of the inventive concept.

FIG. 6 is a flowchart illustrating a method of buffering data required for decoding of a wireless communication device, according to an exemplary embodiment of the inventive concept.

Referring to FIG. 6, the wireless communication device receives a PDCCH including CCEs in operation S100 and may generate a CCE index and LLRs corresponding to the CCE index from the received PDCCH in operation S110. Then, the data management circuit stores the LLRs in the data buffer in operation S120 and may store the address of LLRs in at least one address buffer selected from the address buffers based on the CCE index in operation S130. According to embodiments, operation S120 and operation S130 may be performed in parallel.

Figure 7:
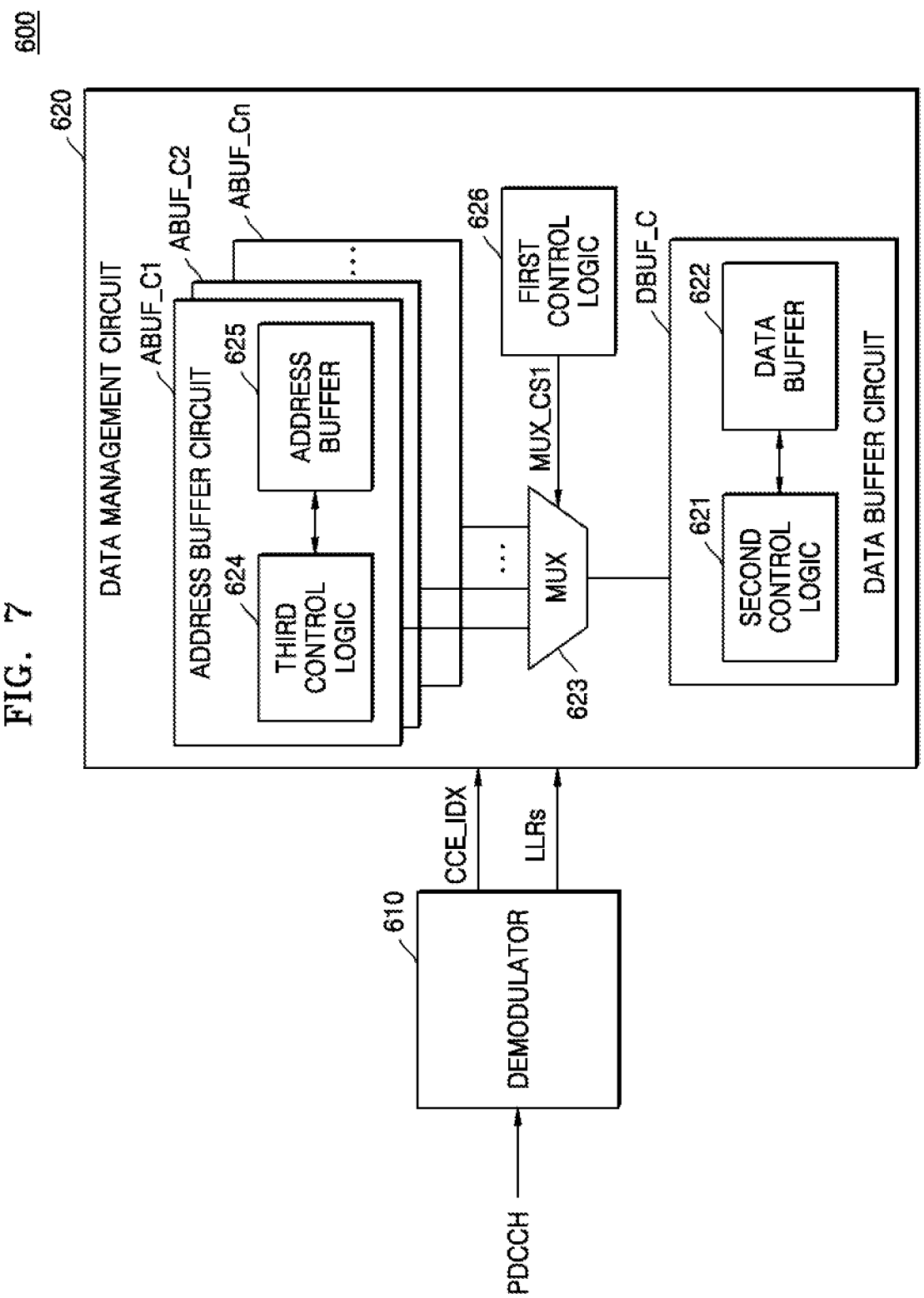
FIG. 7 is a block diagram illustrating a controller of a wireless communication device according to an exemplary embodiment of the inventive concept in detail.

FIG. 7 is a block diagram illustrating a controller of a wireless communication device 600 according to an exemplary embodiment of the inventive concept in detail.

The wireless communication device 600 may include a demodulator 610 and a data management circuit 620. The demodulator 610 may generate LLRs and a CCE index CCE_IDX corresponding to the LLRs by receiving the PDCCH converted from the RF band into the base band and performing the demodulating operation. The CCE index CCE_IDX may be information that represents a CCE corresponding to the output LLRs. The data management circuit 620 may include a data buffer circuit DBUF_C, a first multiplexer 623, a plurality of address buffer circuits ABUF_C1 to ABUF_Cn, an a first control logic 626. The data buffer circuit DBUF_C may include a second control logic 621 and a data buffer circuit 622. The address buffer circuit ABUF_C1 may include a third control logic 624 and an address buffer 625. A configuration of the address buffer circuit ABUF_C1 may also be applied to the other address buffer circuits ABUF_C2 to ABUF_Cn. The number of address buffer circuits ABUF_C1 to ABUF_Cn may be determined in accordance with the number of supportable aggregation levels for the CCEs included in the PDCCH. For example, in the wireless communication system in which up to 32 CCE aggregation levels are supportable, the data management circuit 620 may be implemented to include 32 address buffer circuits ABUF_C1 to ABUF_Cn.

In describing an operation of the data buffer circuit DBUF_C first, the second control logic 621 may sequentially store the LLRs received from the demodulator 610 in the data buffer circuit 622. According to embodiments, the second control logic 621 classifies the LLRs by CCE with reference to the CCE index CCE_IDX and may store the classified LLRs in the data buffer circuit 622. When the LLRs are stored in the data buffer circuit DBUF_C, the first control logic 626 may connect at least one of the address buffer circuits ABUF_C1 to ABUF_Cn to the data buffer circuit DBUF_C by providing a first control signal MUX_CS1 to the first multiplexer 623 with reference to the CCE index CCE_IDX.

For example, when the address buffer circuit ABUF_C1 and the data buffer circuit DBUF_C are connected through the first multiplexer 623, the third control logic 624 may request an address. The LLRs corresponding to CCEs of PDCCH candidates of a CCE aggregation level assigned to the address buffer circuit ABUF_C1 are stored to the second control logic 621. The second control logic 621 may provide the address in which the LLRs are stored to the third control logic 624 in response to the request. The third control logic 624 may store the received address in the address buffer 625.

As an embodiment, the second control logic 621 of the data buffer circuit DBUF_C stores the LLRs generated by the demodulator 610 in the data buffer circuit 622 and may provide the address in which the LLRs are stored to at least one of the address buffer circuits ABUF_C1 to ABUF_Cn based on the CCE index CCE_IDX corresponding to the LLRs. As a result, the address buffer circuits ABUF_C1 to ABUF_Cn may respectively store addresses in which LLRs corresponding to CCEs of PDCCH candidates of CCE aggregation levels assigned are stored.

Figure 8:
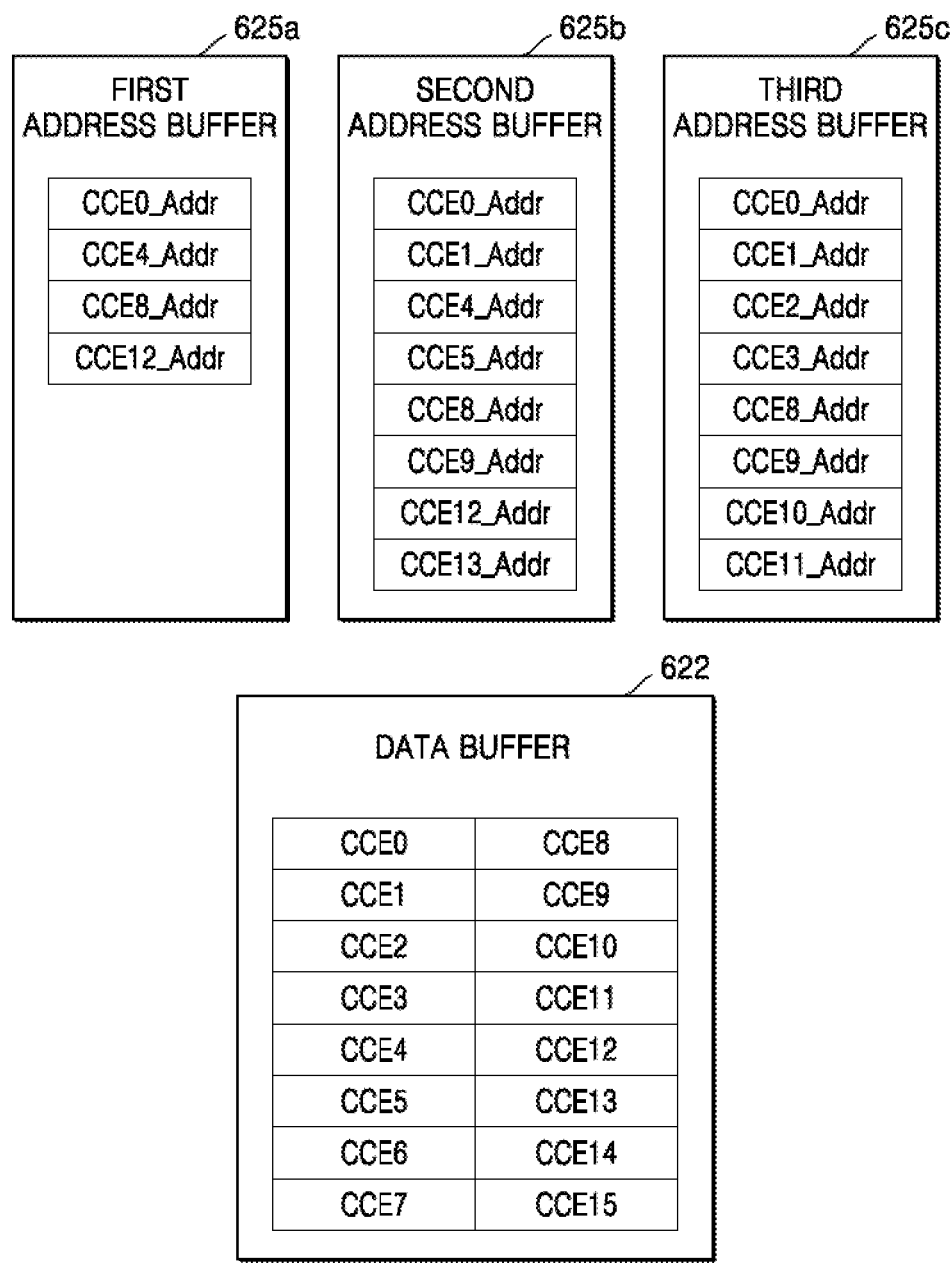
FIG. 8 is a view illustrating information stored in a data buffer and first to third address buffers according to an exemplary embodiment of the inventive concept.

FIG. 8 is a view illustrating information stored in the data buffer circuit 622 and first to third address buffers 625*a* to 625*c* according to an exemplary embodiment of the inventive concept. FIG. 8 will be described with reference to FIGS. 5 and 7 for clarification.

In FIG. 5, the three CCE aggregation levels 503, 504, and 505 are applied to the PDCCH. Among the address buffer circuits, ABUF_C1 to ABUF_Cn of FIG. 7, the three address buffer circuits ABUF_C1 to ABUF_C3 may be used when the PDCCH is received. Referring to FIG. 8, the LLRs generated by demodulating the PDCCH stored in the data buffer circuit 622 and CCE0 to CCE15 and expressed in the data buffer circuit 622 of FIG. 8, represent a configuration in which LLRs corresponding to CCE0 to CCE15 are stored. According to embodiments, LLRs may be classified by CCE and stored in the data buffer circuit 622 or may be stored without additional classification. The second control logic 621 may manage data on an address of the data buffer circuit 622 in which LLRs corresponding to CCE are stored and may provide the data in response to requests from the address buffer circuits ABUF_C1 to ABUF_Cn. In another embodiment, the second control logic 621 may actively provide the data to at least one address buffer circuit connected through the first multiplexer 623.

The first address buffer 625*a* is assigned to store addresses of the PDCCH candidates 506 of the aggregation level-1 503. The second address buffer 625*b* is assigned to store addresses of the PDCCH candidates 507 of the aggregation level-2 504. The third address buffer 625*c* may be assigned to store addresses of the PDCCH candidates 508 of the aggregation level-4 505. Therefore, addresses CCE0_Addr, CCE0_Addr, CCE8_Addr, and CCE12_Addr of CCE0, CCE4, CCE8, and CCE12 that are the PDCCH candidates 506 of the aggregation level-1 503 may be stored in the first address buffer 625*a*, addresses CCE0_Addr, CCE1_Addr, CCE4_Addr, CCE5_Addr, CCE8_Addr, CCE9_Addr, CCE12_Addr, and CCE13_Addr of {CCE0, CCE1}, {CCE4, CCE5}, {CCE8, CCE9}, and {CCE12, CCE13} that are the PDCCH candidates 507 of the aggregation level-2 504 may be stored in the second address buffer 625*b*, and addresses CCE0_Addr, CCE1_Addr, CCE2_Addr, CCE3_Addr, CCE8_Addr, CCE9_Addr, CCE10_Addr, and CCE11_Addr of {CCE0, CCE1, CCE2, CCE3}, and {CCE8, CCE9, CCE10, CCE11} that are the PDCCH candidates 508 of the aggregation level-4 505 may be stored in the third address buffer 625*c*.

Thus, according to an aspect of the inventive concept, a UE may receive a PDCCH, store PDCCH data in a data buffer 622, wherein the PDCCH data correspond to a PDCCH candidates 506, 507, and 508, and store addresses of the PDCCH data in the address buffers 625*a*, 625*b*, and 625*c*. Each of the address buffers may corresponds to one of the PDCCH candidates. Additionally or alternatively, each of the address buffers may correspond to an aggregation level. Then, the UE may perform blind decoding on the PDCCH candidates based on addresses of the PDCCH data stored in the corresponding address buffer.

In some cases, the UE may identify a PDCCH candidate for blind decoding, select an address buffer from the plurality of address buffers based on the identified PDCCH candidate, identify one or more of the addresses of the PDCCH data stored in the selected address buffer, and retrieve a portion of the PDCCH data from the data buffer based on the one or more identified addresses.

Using the above-described configurations of the first to third address buffers 625*a* to 625*c* and the data buffer circuit 622, the LLRs may be prevented from being repeatedly stored and memory can be used more efficiently. For example, an address for a CCE (e.g., CCE0) may be stored multiple times in different address buffers. For example, a single CCE may be associated with multiple PDCCH candidates (e.g., with different PDCCH candidates having different aggregation levels). However, the data associated with the CCE may be stored only once in the data buffer. If the size of the address is less than the size of the data itself, storing the address multiple times may be more efficient than storing the data multiple times.

FIGS. 9A to 9F are views illustrating a resource mapping pattern of control CCEs of a PDCCH. FIG. 10 is a view illustrating a method of storing an address in the first address buffer 625*a*, according to an exemplary embodiment of the inventive concept. A REG bundle described hereinafter may be defined as the least unit including a plurality of interleaved REGs on which the same precoding is performed.

Figure 9A:
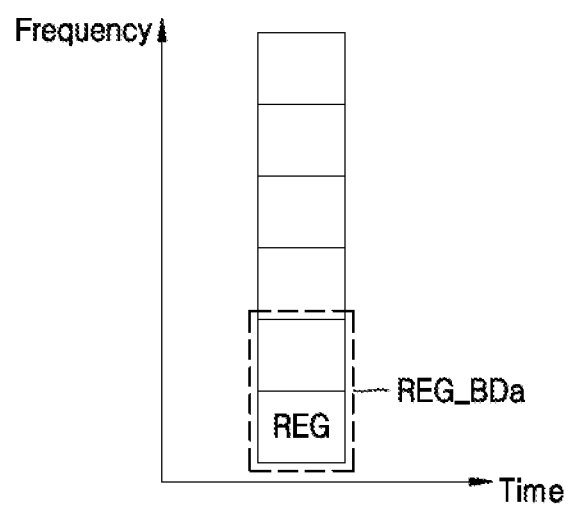
FIGS. 9A to 9F are views illustrating a resource mapping pattern of control channel elements (CCE) of a PDCCH.
Figure 10:
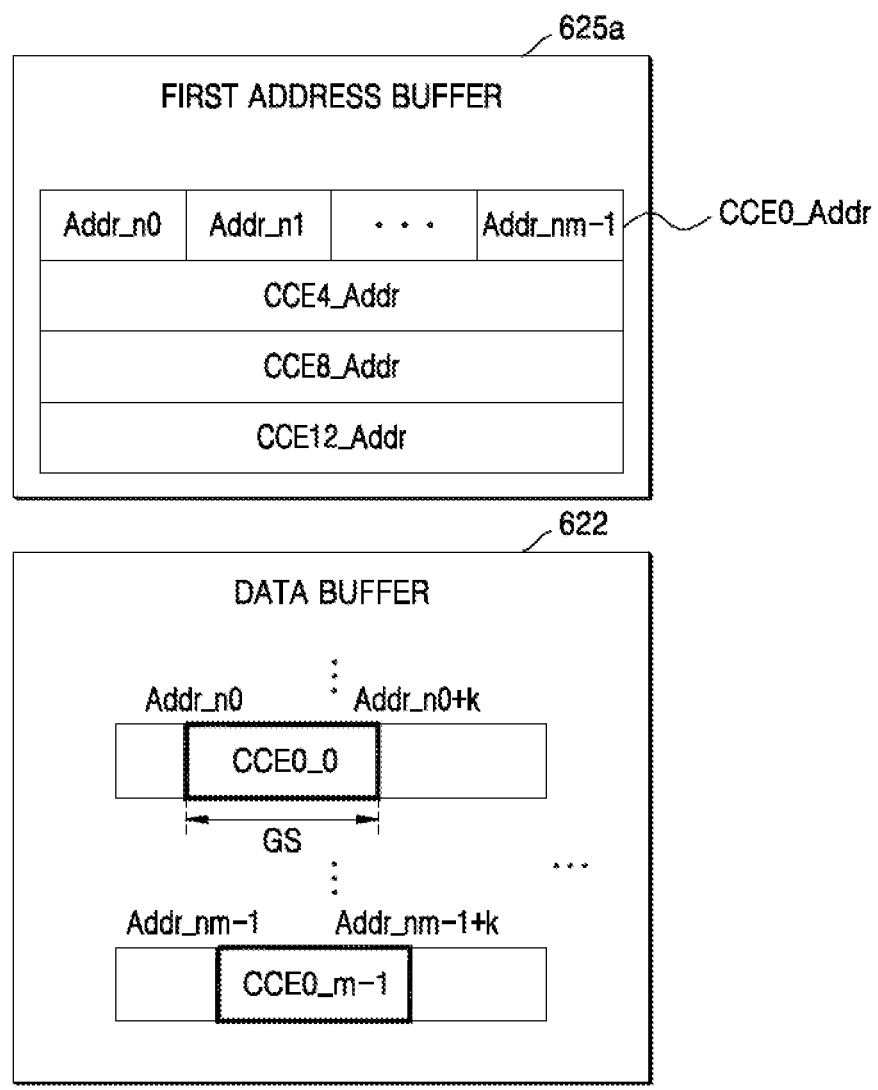
FIG. 10 is a view illustrating a method of storing an address in a first address buffer according to an exemplary embodiment of the inventive concept.

Referring to FIG. 9A, a first REG bundle REG_BDa may be applied as a resource mapping pattern of CCEs of a PDCCH, and the first REG bundle REG_BDa may include two REGs connected in the frequency axis.

Figure 9B:
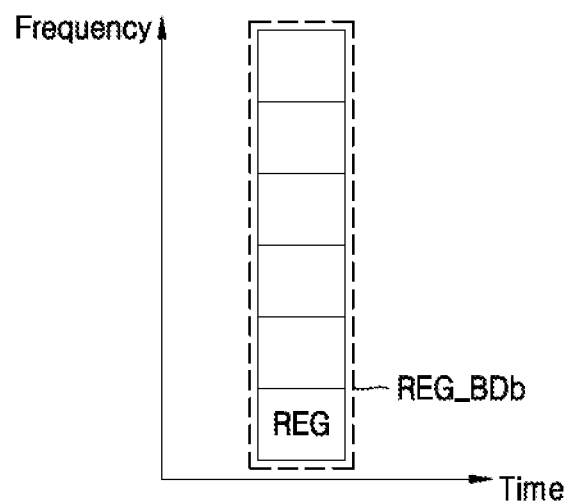

Referring to FIG. 9B, a second REG bundle REG_BDb may be applied as the resource mapping pattern of the CCEs of the PDCCH and the second REG bundle REG_BDb may include six REGs connected in the frequency axis.

Figure 9C:
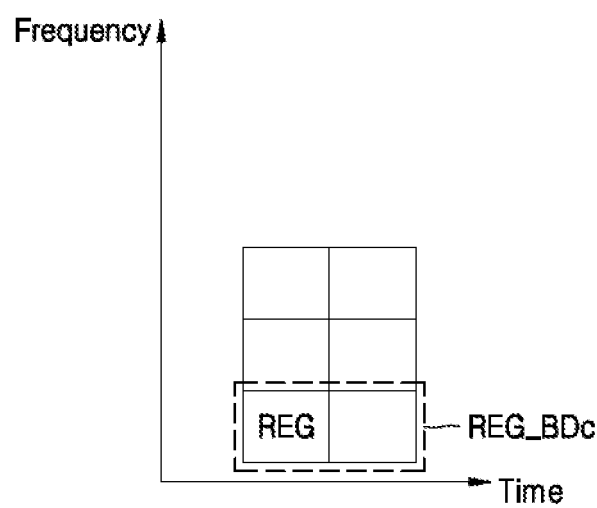

Referring to FIG. 9C, a third REG bundle REG_BDc may be applied as the resource mapping pattern of the CCEs of the PDCCH, and the third REG bundle REG_BDc may include two REGs connected in a time axis.

Figure 9D:
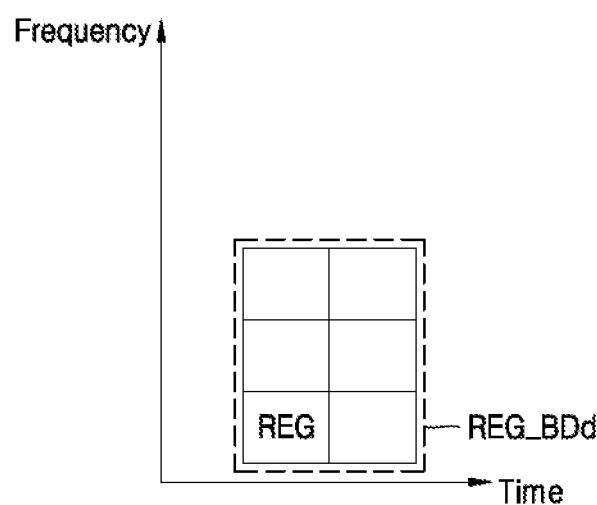

Referring to FIG. 9D, a fourth REG bundle REG_BDd may be applied as the resource mapping pattern of the CCEs of the PDCCH, and the fourth REG bundle REG_BDd may include six REGs connected in the frequency axis and the time axis.

Figure 9E:
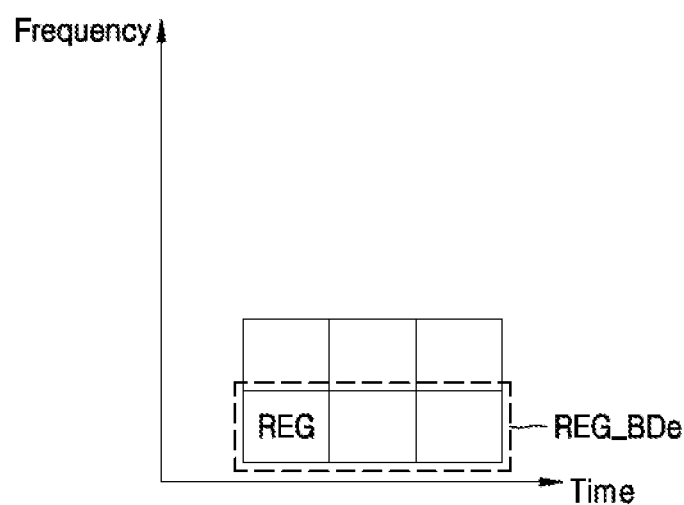

Referring to FIG. 9E, a fifth REG bundle REG_BDe may be applied as the resource mapping pattern of the CCEs of the PDCCH, and the fifth REG bundle REG_BDe may include three REGs connected in the time axis.

Figure 9F:
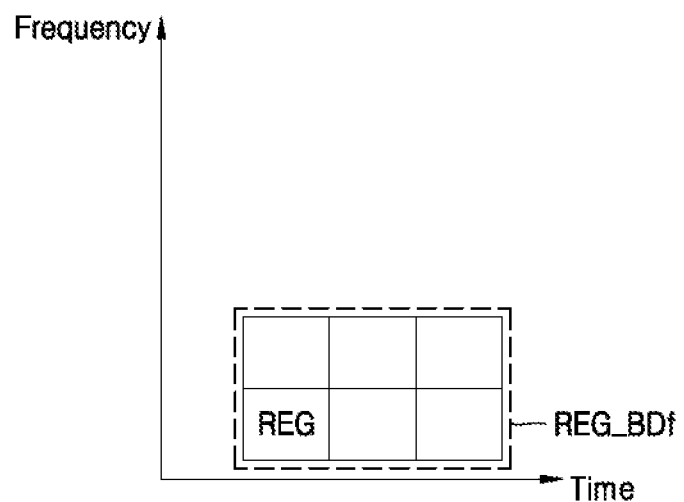

Referring to FIG. 9F, a sixth REG bundle REG_BDf may be applied as the resource mapping pattern of the CCEs of the PDCCH, and the sixth REG bundle REG_BDf may include six REGs connected in the frequency axis and the time axis.

As illustrated in FIGS. 9A to 9F, the resource mapping pattern of the PDCCH may be configured by determining the first to sixth REG bundles REG_BDa to REG_BDf. Although various shapes of the first to sixth REG bundles REG_BDa to REG_BDf are considered, decoding is performed on the PDCCH while resources are mapped in the time axis and are demapped in the frequency axis. A continuous output of LLRs may be guaranteed in units of REGs as a result of performing the demodulating operation on the PDCCH. For example, when one REQ includes 12 resource elements, while the demodulating operation is performed on the PDCCH, continuity of LLRs of 24 bits corresponding to a certain CCE may be guaranteed. The LLRs with guaranteed continuity may be sequentially inputted to the decoder 132 (FIG. 1) and may be decoded by the decoder 132. In FIG. 10, a method of storing an address in the address buffer based on the above-described continuity of the LLRs will be described.

Referring to FIG. 10, LLRs corresponding to CCE0 are divided into m LLR groups CCE0_0 to CCE0_$m$−1 with guaranteed continuity and may be stored in the data buffer circuit 622. For example, a first LLR group CCE0_0 may include LLRs with guaranteed continuity, which is generated by being demodulated by the demodulator 610 (FIG. 7), and the LLRs may be continuously stored between an address Addr_n0+k and an address Addr_n0+k of the data buffer circuit 622. Additionally, an (m−1)th LLR group CCE0_$m$−1 may include LLRs with guaranteed continuity, which is generated by being demodulated by the demodulator 610 (FIG. 7), and the LLRs may be continuously stored between an address Addr_nm−1 and an address Addr_nm−1+k of the data buffer circuit 622.

In the first address buffer 625a, the address CCE0_Addr of the LLRs corresponding to CCE0 may include representative addresses of addresses in which the LLR groups CCE0_0 to CCE0_$m$−1 are respectively stored. According to embodiments, the representative addresses may be start addresses or final addresses of the LLR groups CCE0_0 to CCE0_$m$−1. For example, the start addresses Addr_n0 to Addr_nm−1 of the LIR groups CCE0_0 to CCE0_$m$−1 may be stored in the first address buffer 625a. By such a method, in the first address buffer 625a, addresses CCE4_Addr, CCE8_Addr, and CCE12_Addr of the LLRs corresponding to CCE4, CCE8, and CCE12 may be implemented to include representative addresses of the LLR groups. In an embodiment, a magnitude GS of the LLR group CCE0_0 may vary in accordance with the resource mapping pattern of the CCEs of the PDCCH.

The use of memory of the first address buffer 625a may be efficiently improved by not storing all of the LIR addresses of the LLR groups with guaranteed continuity. Rather, storing the representative addresses of the LLR groups considering the resource mapping pattern of the CCEs of the PDCCH. Such a method may be applied to other address buffers.

Figure 11:
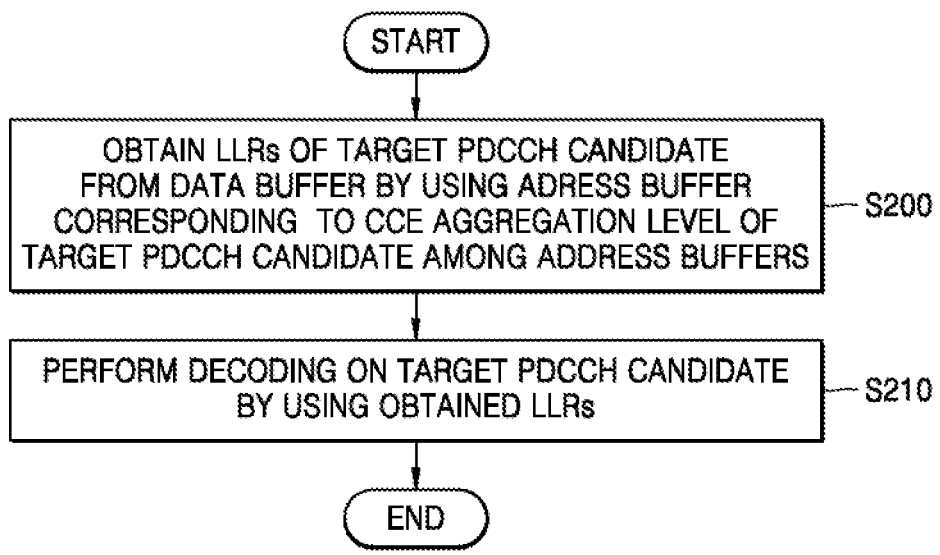
FIG. 11 is a flowchart illustrating a method of performing decoding of a wireless communication device according to an exemplary embodiment of the inventive concept.

FIG. 11 is a flowchart illustrating a method of performing decoding of a wireless communication device, according to an exemplary embodiment of the inventive concept. Hereinafter, an operation of performing decoding on one target PDCCH candidate will be described.

Referring to FIG. 11, the data management circuit may obtain LLRs of the target PDCCH candidate from the data buffer by using an address buffer corresponding to a CCE aggregation level of the target PDCCH candidate among the address buffers. The data management circuit may provide the obtained LLRs to the decoder, and the decoder may perform decoding on the target PDCCH candidate by using the obtained LLRs. The above-described operation may be repeated until decoding is performed on the PDCCH candidates.

Figure 12:
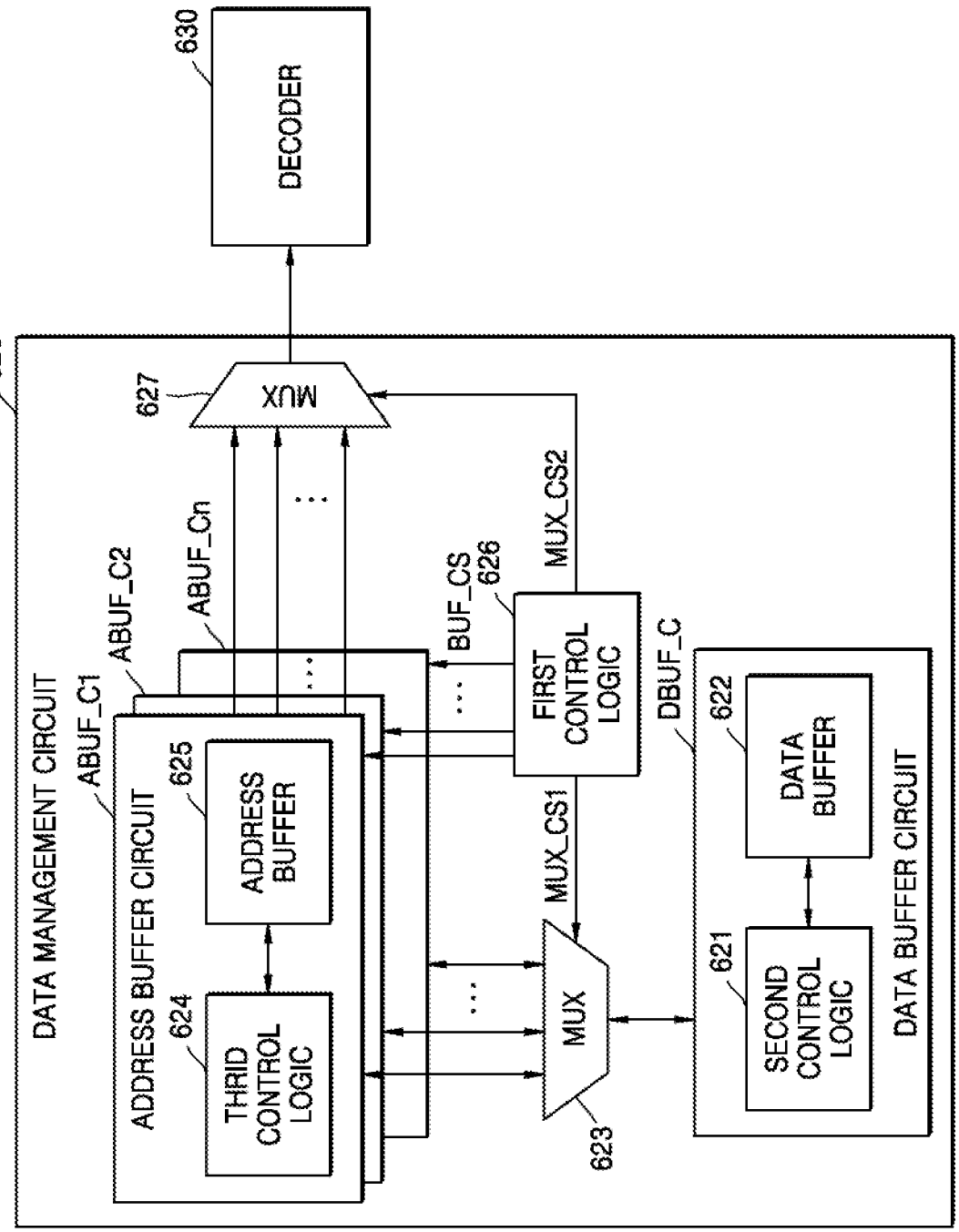
FIG. 12 is a block diagram illustrating a controller of a wireless communication device according to an exemplary embodiment of the inventive concept in detail.

FIG. 12 is a block diagram illustrating a controller of a wireless communication device 600 according to an exemplary embodiment of the inventive concept in detail. Hereinafter, the description given with reference to FIG. 7 is omitted.

Referring to FIG. 12, the wireless communication device 600 may include the data management circuit 620 and a decoder 630. The decoder 630 receives data (for example, LLRs) on PDCCH candidates required for decoding from the data management circuit 620 and may perform blind decoding on the received data. Additionally, the data management circuit 620 may further include a second multiplexer 627 in comparison with FIG. 7 and the first control logic 626 may perform control so that data on target PDCCH candidates required by the decoder 630 may be provided to the decoder 630. In detail, the first control logic 626 may control the first multiplexer 623, the second multiplexer 627, the address buffer circuits ABUF_C1, and ABUF_C2. The first control logic 626 controls these components so data on at least one PDCCH candidate of a target aggregation level, to be decoded when the decoder 630 performs blind decoding, may be provided at proper timing.

For example, to provide data on PDCCH candidates of a prescribed aggregation level, the first control logic 626 enables the address buffer circuit ABUF_C1 by providing a buffer control signal BUF_CS to the address buffer circuit ABUF_C1 and may connect the address buffer circuit ABUF_C1 to the data buffer circuit DBUF_C by providing the first control signal MUX_CS1 to the first multiplexer 623. The prescribed aggregation level is stored in the address buffer circuit ABUF_C1. Additionally, the first control logic 626 may connect the address buffer circuit ABUF_C1 to the decoder 630 by providing a second control signal MUX_CS2 to the second multiplexer 627. At this time, the third control logic 624 may request LLRs to the data buffer circuit 622 by using an address of data on PDCCH candidates stored in an address buffer 625, and the second control logic 621 may provide LLRs read from the data buffer circuit 622 with reference to the data address to the address buffer circuit ABUF_C1. Additionally, as in FIG. 10, when a representative address of an LLR group is stored in the address buffer 625, the second control logic 621 may read LLRs from the data buffer circuit 622 considering a magnitude GS of the LIR group. The address buffer circuit ABUF_C1 may provide LLRs received from the data buffer circuit DBUF_C to the decoder 630 as data on PDCCH candidates. The configuration of FIG. 12 is an exemplary embodiment. The inventive concept is not limited thereto. The data buffer circuit DBUF_C may directly provide data on target PDCCH candidates to the decoder 630.

The data management circuit 620 may provide the data on the PDCCH candidates for the blind decoding to the decoder 630 at proper timing by using the data buffer circuit DBUF_C and the plurality of address buffer circuits ABUF_C1 TO ABUF_Cn.

Figure 13:
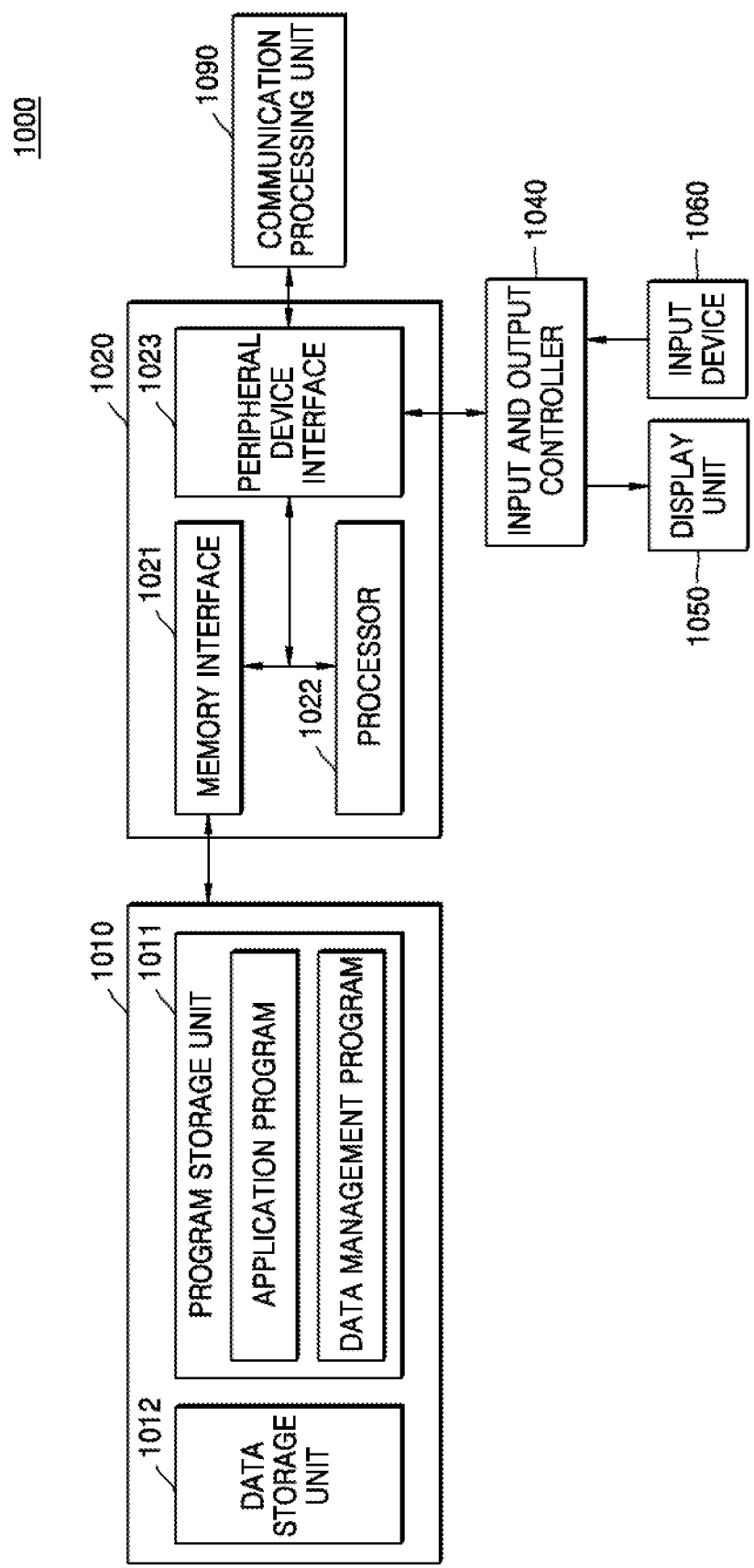
FIG. 13 is a block diagram illustrating an electronic device according to an exemplary embodiment of the inventive concept.

FIG. 13 is a block diagram illustrating an electronic device 1000 according to an exemplary embodiment of the inventive concept.

Referring to FIG. 13, the electronic device 1000 may include memory 1010, a processor unit 1020, an input and output controller 1040, a display unit 1050, an input device 1060, and a communication processing unit 1090. Here, the memory 1010 may constitute multiple memory units. The respective components will be described as follows.

The memory 1010 may include a program storage unit 1011 for storing a program for controlling an operation of the electronic device 1000 and a data storage unit 1012 for storing data generated during the execution of the program. The data storage unit 1012 may store data required for operations of an application program 1013 and a data management program 1014. The program storage unit 1011 may include the application program 1013 and the data management program 1014. Here, the program included in the program storage unit 1011 as a set of instructions may be expressed as an instruction set.

The application program 1013 includes an application program that operates in the electronic device. The application program 1013 includes instructions of an application driven by a processor 1022. The data management program 1014 may control an operation of storing and managing data required for performing decoding according to embodiments of the inventive concept. The processor 1022 stores data required for decoding (for example, LLRs generated by demodulating a PDCCH) in a data buffer (not shown) through the data management program 1014, may individually store an address of the data in a plurality of address buffers (not shown) in accordance with a CCE aggregation level, and may perform a blind decoding operation on PDCCH candidates by using a data buffer (not shown) and address buffers (not shown). A memory interface 1021 may control access to a component such as the processor 1022 or a peripheral device interface 1023 to the memory 1010.

The peripheral device interface 1023 may control a connection between an input and output peripheral device of a base station and the processor 1022 and the memory interface 1021. The processor 1022 controls the base station to provide a corresponding service by using at least one software program. At this time, the processor 1022 executes at least one program stored in the memory 1010 and may provide a service corresponding to the program.

An input and output controller 1040 may provide an interface between input and output devices, such as the display unit 1050 and the input device 1060, and the peripheral device interface 1023. The display unit 1050 displays state information, input characters, moving pictures, and still pictures. For example, the display unit 1050 may display information on an application program driven by the processor 1022.

The input device 1060 may provide input data generated by a selection of an electronic device to the processor unit 1020 through the input and output controller 1040. At this time, the input device 1060 may include a keypad including at least one hardware button and a touchpad for sensing touch information. For example, the input device 1060 may provide the touch information such as a touch, touch movement, and touch release, which is sensed by the touchpad, to the processor 1022 through the input and output controller 1040. The electronic device 1000 may include the communication processing unit 1090 for performing a communication function for voice communication and data communication.

While the inventive concept has been particularly shown and described with reference to embodiments thereof, it will be understood that various changes in form and details may be made therein without departing from the spirit and scope of the following claims.

What is claimed is:

1. A method of operating a wireless communication device, the method comprising:
   receiving a physical downlink control channel (PDCCH) including a plurality of control channel elements (CCE);
   storing a plurality of log likelihood ratios (LLRs) in a data buffer, wherein the LLRs are generated by demodulating the PDCCH and correspond to a plurality of PDCCH candidates, each of the PDCCH candidates having an aggregation level corresponding to a number of CCEs;
   storing at least one address of the LLRs in a plurality of address buffers; and
   performing blind decoding on the PDCCH candidates by using the data buffer and the address buffers.

2. The method of claim 1, wherein:
   the storing of the at least one address of the LLRs in the address buffers further comprises:
   storing an address of a target LLR in at least one address buffer among the address buffers based on a CCE index corresponding to the target LLR.

3. The method of claim 2, wherein:
   the CCE index is obtained by demodulating the PDCCH.

4. The method of claim 1, wherein:
   the storing of the plurality of LLRs in the data buffer and the storing of the at least one address of the LLRs in the address buffers are performed in parallel.

5. The method of claim 1, wherein:
   when a number of supportable aggregation levels is a natural number N, a number of address buffers is N, and each address buffer of the plurality of address buffers stores addresses of LLRs of at least one PDCCH candidate having an aggregation level corresponding to the address buffer.

6. The method of claim 1, wherein:
   the address buffers store a representative address of an LLR group including LLRs continuously stored in the data buffer in accordance with a resource mapping pattern of the CCEs of the PDCCH.

7. The method of claim 1, wherein:
   the performing of the blind decoding on the PDCCH candidates further comprises:
   obtaining LLRs of a target PDCCH candidate from the data buffer with reference to an address buffer corresponding to an aggregation level of the target PDCCH candidate among the address buffers; and
   performing decoding on the target PDCCH candidate by using the obtained LLRs.

8. The method of claim 1, wherein:
the data buffer and the address buffers are physically or virtually divided.

9. A method of operating a wireless communication device for managing data required for performing blind decoding, the method comprising:
generating a control channel element (CCE) index and LLRs corresponding thereto from a physical downlink control channel (PDCCH) including a plurality of CCEs;
storing the LLRs in a data buffer; and
storing at least one address of the LLRs in at least one address buffer selected from a plurality of address buffers based on the CCE index.

10. The method of claim 9, wherein:
the address buffers are respectively assigned to store addresses of LLRs corresponding to CCEs included in at least one PDCCH candidate, which correspond to different CCE aggregation levels.

11. The method of claim 10, wherein:
a number of address buffers suits for a number of supportable CCE aggregation levels.

12. The method of claim 9, wherein:
the storing of the at least one address of the LLRs further comprises:
storing a representative address of an LLR group including LLRs continuously stored in the data buffer in accordance with a resource mapping pattern of the CCEs of the PDCCH.

13. The method of claim 9, further comprising:
performing blind decoding on the PDCCH candidates that suit for a CCE aggregation level of the PDCCH by using the data buffer and the address buffers.

14. The method of claim 13, wherein:
the performing of the blind decoding further comprises:
obtaining LLRs of a target PDCCH candidate from the data buffer with reference to an address buffer corresponding to a CCE aggregation level of the target PDCCH candidate among the address buffers; and
performing decoding on the target PDCCH candidate by using the obtained LLRs.

15. A wireless communication device comprising:
a radio frequency (RF) integrated circuit configured to receive a physical downlink control channel (PDCCH) including a plurality of control channel elements (CCEs) from a base station; and
a controller configured to perform blind decoding on a plurality of PDCCH candidates in accordance with an aggregation level for the CCEs,
wherein the controller further comprises:
a data management circuit configured to store LLRs generated from the PDCCH in a data buffer and to store at least one address of the LLRs in at least one address buffer selected from a plurality of address buffers based on a CCE index corresponding to the LLRs.

16. The wireless communication device of claim 15, wherein:
the address buffers respectively store addresses of LLRs corresponding to CCEs included in at least one PDCCH candidate, which correspond to different aggregation levels.

17. The wireless communication device of claim 15, wherein:
the data management circuit stores a representative address of an LLR group including LLRs continuously stored in the data buffer in accordance with a resource mapping pattern of CCEs of the PDCCH in the at least one selected address buffer.

18. The wireless communication device of claim 15, wherein:
the controller performs blind decoding on the PDCCH candidates using the data buffer and the address buffers.

19. The wireless communication device of claim 15, wherein:
a number of address buffers corresponds to a number of supportable aggregation levels.

20. The wireless communication device of claim 15, wherein:
the data buffer and the address buffers are physically or virtually divided.

21. A method of wireless communication, the method comprising:
receiving a physical downlink control channel (PDCCH);
storing PDCCH data in a data buffer, wherein the PDCCH data correspond to a plurality of PDCCH candidates;
storing addresses of the PDCCH data in a plurality of address buffers, wherein each of the plurality of address buffers corresponds to one of the PDCCH candidates;
performing blind decoding on each of the PDCCH candidates based on addresses of the PDCCH data stored in a corresponding address buffer of the plurality of address buffers.

22. The method of claim 21, further comprising:
identifying a PDCCH candidate for blind decoding;
selecting an address buffer from the plurality of address buffers based on the identified PDCCH candidate;
identifying one or more of the addresses of the PDCCH data stored in the selected address buffer; and
retrieving a portion of the PDCCH data from the data buffer based on the one or more identified addresses, wherein the blind decoding is performed based on the retrieving.

* * * * *